(12) United States Patent
Takeda

(10) Patent No.: US 6,957,049 B1
(45) Date of Patent: Oct. 18, 2005

(54) MOBILE COMMUNICATION UNIT WITH BONE CONDUCTION SPEAKER

(75) Inventor: Takeshi Takeda, Tokyo (JP)

(73) Assignee: Temco Japan Co., Ltd., Tokyo (JP)

(*) Notice: Subject to any disclaimer, the term of this patent is extended or adjusted under 35 U.S.C. 154(b) by 0 days.

(21) Appl. No.: 09/762,202

(22) PCT Filed: Dec. 27, 1999

(86) PCT No.: PCT/JP99/07350

§ 371 (c)(1),
(2), (4) Date: Feb. 5, 2001

(87) PCT Pub. No.: WO00/76184

PCT Pub. Date: Dec. 14, 2000

(30) Foreign Application Priority Data

Jun. 3, 1999 (JP) ................... 11-156262

(51) Int. Cl.[7] ............................. H04B 1/38; H04B 1/08
(52) U.S. Cl. ............... 455/90.3; 455/575.1; 455/575.6; 455/569.1; 455/350; 455/351; 381/326; 381/380; 379/433.02
(58) Field of Search ................. 455/550.1, 575.1, 455/575.6, 90.3, 569.1, 66.1, 74, 344, 350, 455/351; 381/151, 380, 370, 326, 328; 379/420.01, 379/420.02, 420.03, 420.04, 433.1

(56) References Cited

U.S. PATENT DOCUMENTS

| | | | |
|---|---|---|---|
| 4,322,585 A * | 3/1982 | Liautaud | 381/151 |
| 4,847,818 A * | 7/1989 | Olsen | 368/10 |
| 5,239,521 A | 8/1993 | Blonder | |
| 5,323,468 A * | 6/1994 | Bottesch | 381/151 |
| 5,597,102 A | 1/1997 | Saarikko et al. | |
| 5,659,611 A * | 8/1997 | Saksa | 379/433.1 |
| 5,706,353 A * | 1/1998 | Arai et al. | 381/77 |
| 5,724,667 A | 3/1998 | Furano | |
| 5,757,934 A * | 5/1998 | Yokoi | 381/326 |
| 6,301,487 B1 * | 10/2001 | Nakamura | 455/550.1 |
| 6,775,205 B1 * | 8/2004 | Sporn | 368/10 |

FOREIGN PATENT DOCUMENTS

| | | |
|---|---|---|
| JP | 6113000 | 4/1994 |
| JP | 7143214 | 6/1995 |
| JP | 8009006 | 1/1996 |
| JP | 8046543 | 2/1996 |
| JP | 2001160267 | 6/2001 |

* cited by examiner

*Primary Examiner*—Sonny Trinh
*Assistant Examiner*—Un C Cho
(74) *Attorney, Agent, or Firm*—Browdy and Neimark, P.L.L.C.

(57) ABSTRACT

A lightweight miniature mobile communication unit allows the user to listen sufficiently and talk quietly in a noisy place so that the user can make a call without disturbing nearby people in the crowd. The mobile communication unit uses a bone conduction speaker (1) separated from the main body (2) instead of a built-in speaker or an external earphone.

3 Claims, 1 Drawing Sheet

MOBILE COMMUNICATION UNIT WITH BONE CONDUCTION SPEAKER

FIELD OF THE INVENTION

The present invention relates to a mobile communication unit provided with a bone conduction speaker, and more particularly to the mobile communication unit of a wrist-mounted type in which: an ordinary air-conduction speaker is removed from a main body of the mobile communication unit; and, in place of such ordinary speaker, a bone conduction speaker is detachably mounted on a finger tip of a user for receiving a voice sound without using the user's ears.

BACKGROUND OF THE INVENTION

In recent years, a mobile communication unit such as a cell phone unit, a PHS (personal handy-phone system) and the like has been considerably reduced in size and in weight. However, such a mobile communication unit has its essential construction remain substantially unchanged. In other words, the mobile communication unit is essentially constructed of its components contained in a single-piece casing, which components are, for example such as: a wireless telephone functional portion; a battery portion; a display portion; a control portion; a microphone portion; and, an ordinary air-conduction speaker portion. Consequently, in use, it is necessary for the user of such mobile communication unit to have his/her ear and mouth disposed adjacent to the air-conduction speaker portion and the microphone portion of the mobile communication unit, respectively. Due to this, it is difficult to further downsize the today's mobile communication unit having the above essential construction.

Although there are various types of external components such as external ear phones and external microphones which are connected with the mobile communication system when used in place of the system's built-in speaker and microphone, any one of these external components is connected with the mobile communication system through an electric connecting cord. Due to the presence of this connecting cord, handling of such external components is relatively cumbersome, which impairs the mobile communication system in portability and in wearability (i.e., suitability for being worn or fit). This makes it difficult for the user of this type of mobile communication unit to immediately answer a telephone call.

In this connection, an ultra-compact mobile communication unit of a wrist-mounted type has been experimentally developed. However, in use, when the user has a speaker portion of this type of ultra-compact unit brought into contact with his/her ear to answer a phone call, it is impossible for the user to have a microphone portion of this ultra-compact unit disposed adjacent to his/her mouth, which makes it difficult for the microphone portion of the unit to catch the user's voice sound. Further, in the case where an external earphone is used in place of the speaker portion of this wrist-mounted type ultra-compact mobile communication unit, an electric connecting cord extending from the user's wrist to his/her ear is a must for such wrist-mounted type unit. However, the presence of this connecting cord impairs such wrist-mounted type unit in wearability (i.e., suitability for being worn).

As described above, the wrist-mounted type ultra-compact mobile communication unit, which is much smaller in size than a conventional cell phone and the like, suffers from various types of disadvantages. Consequently, it is an object of the present invention to provide an ultra-compact mobile communication unit which is smaller in size and lighter in weight. Furthermore, this ultra-compact mobile communication unit enables a user thereof to easily perceive any sounds in communication even in a high-noise environment, and also enables the user to speak in a whisper without making the people around the user uncomfortable.

The ultra-compact mobile communication unit of the present invention may be any one of cell phones, personal handy-phone systems and the like, which one is characterized by its bone conduction speaker. This bone conduction speaker is separated from a main body of the mobile communication unit, and enables its user to catch any voice sound received by the mobile communication unit, without fail.

Further, the present invention is characterized in that the ultra-compact mobile communication unit is detachably mounted on an inner side of the user's wrist with the use of a band and the like.

Still further, the present invention is characterized in that the ultra-compact mobile communication unit uses a bone conduction speaker provided with a vibrating portion, wherein the vibrating portion of the bone conduction speaker has its rear surface formed into a finger-mounted portion which assumes a cap shape or a ring shape to enable the bone conduction speaker to be mounted on a finger tip of the user.

Further, the present invention is characterized in that an electric connecting cord through which the bone conduction speaker is electrically connected with a main body of the ultra-compact mobile communication unit is capable of being withdrawn into the main body of the unit by using a take-up reel and like means which is mounted in the main body of the mobile communication unit.

Still further, the present invention is characterized in that the main body of the ultra-compact mobile communication unit is provided with a clip in a rear side of the main body, wherein the clip enables the main body of the mobile communication unit to be mounted on a band of the user's wrist watch.

BEST MODE FOR CARRYING OUT THE INVENTION

Figure 1:
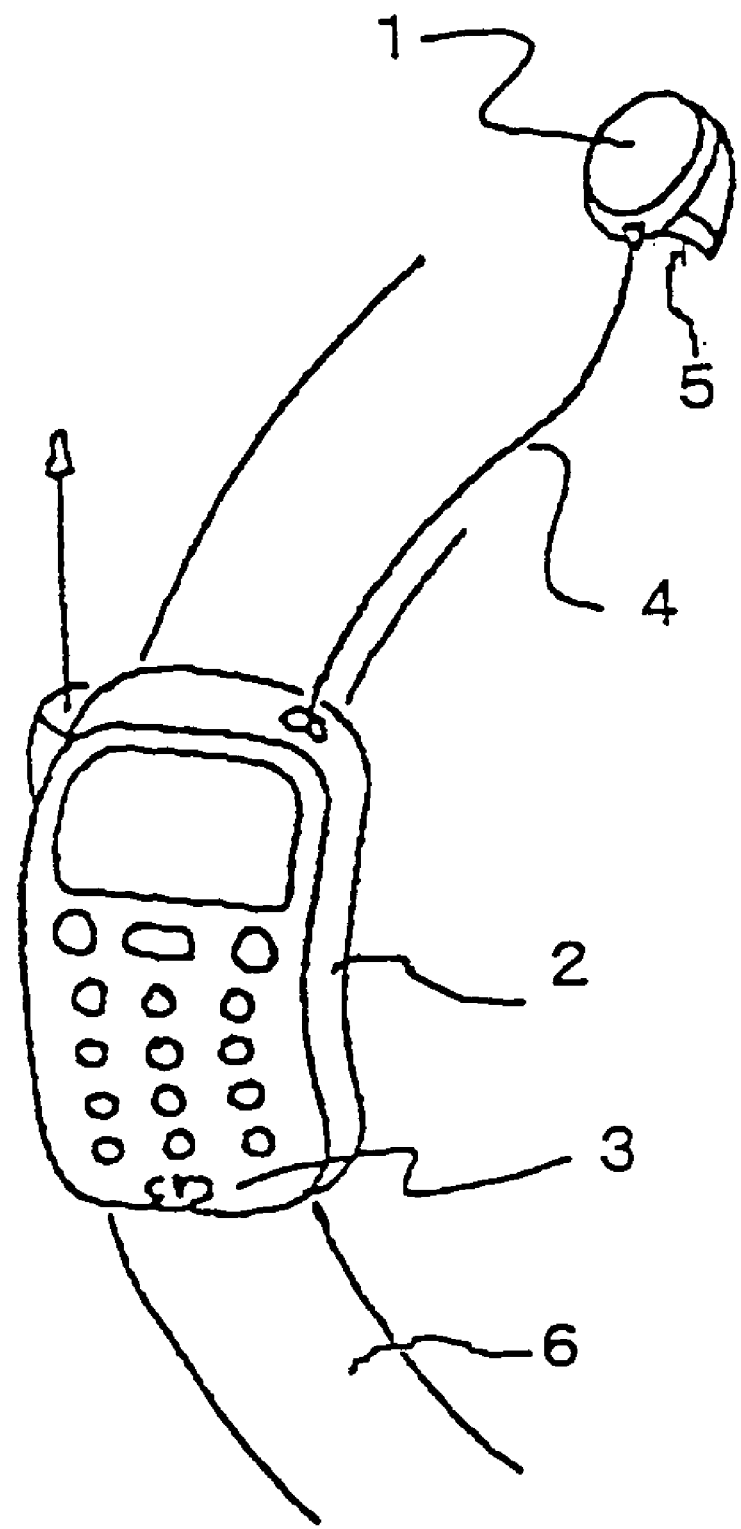
FIG. 1 is a view illustrating an embodiment of the mobile communication unit of the present invention, wherein the mobile communication unit is provided with a bone conduction speaker.

With reference to the accompanying drawing, an embodiment or best mode of the present invention will be described. As shown in FIG. 1, a mobile communication unit of the present invention is provided with a bone conduction speaker 1, and is constructed of: a main body casing 2 containing therein the bone conduction speaker 1, a speaker amplifier, a microphone amplifier and a battery; a microphone portion 3 which is disposed inside the main body casing 2 so as to be adjacent to a lower portion of the main body casing 2; and, an electric connecting cord 4 for electrically connecting the main body casing 2 with the bone conduction speaker 1. Incidentally, preferably, the connecting cord 4 is capable of being withdrawn into the main body casing 2 by using a take-up reel and like means.

The bone conduction speaker 1 is connected with the main body casing 2 through the connecting cord 4 which has a length of approximately 15 cm. If necessary, a finger-mounted portion 5, which assumes a cap shape or a ring shape, is provided in a rear surface of a vibrating portion of the bone conduction speaker 1. The main body casing 2 of the mobile communication unit is mounted on an inner side of a wrist of the user by using a band 6 and the like. It is also possible to provide a clip in a rear side of the main body casing 2 of the mobile communication unit, through which clip the main body casing 2 of the mobile communication unit is mounted on a band of the user's wrist watch.

In the above construction of the present invention, when the user makes or answers a phone call, one or two of his/her fingers (in general, his/her first finger and thumb) is or are inserted into the finger-mounted portion 5 of the bone conduction speaker 1 to have the bone conduction speaker 1 brought into soft contact with his/her forehead, temple, cheekbone or an area between his/her eyes in order to catch a received voice sound. In the case of the sending of a phone call, since the microphone portion 3 of the main body casing 2 of the mobile communication unit mounted on the inner side of the user's wrist is capable of being disposed adjacent to the user's mouth, it is possible for the microphone portion 3 of the mobile communication unit to sufficiently catch the user's voice sound.

When the microphone portion 3 of the mobile communication unit is disposed in the inner side of the user's hand, it is possible for the user to cover his/her mouth with his/her hand while he/she talks with someone by using the mobile communication unit, which makes it possible for the user to speak in a whisper much smaller in level than that he/she uses in one-piece communication units such as a cell phone, a personal handy-phone system, a radio communication unit or the like.

INDUSTRIAL APPLICABILITY

The present invention having the above construction is characterized as follows:
1) it is possible for the user to have his/her ears be free from the built-in speaker portion of the mobile communication unit in use. This releases the mobile communication unit from its minimum size restriction on its heretofore required distance between the mouth and the ear of the user, and therefore makes it possible to further downsize the main body of the mobile communication unit;
2) the mobile communication unit enables its user to easily perceive any voice sound in communication even in a high-noise environment, and also enables the user to speak in a whisper without making the people around him/her uncomfortable, wherein such whisper is much smaller in sound level than that he/she uses in one-piece communication units such as a cell phone, a personal handy-phone system, a radio communication unit or the like;
3) the mobile communication unit is of a wrist-mounted type which is excellent in wearability (i.e., suitability for being worn) and in portability when the mobile communication unit is not used, wherein the mobile communication unit of the wrist-mounted type enables its user to relax his/her position when he/she uses the mobile communication unit; and
4) since the mobile communication unit is capable of sending its received voice sound signal directly to the user's hearing organ by means of the bone conduction speaker, the mobile communication unit is helpful to even a user suffering from adventitious slight hearing loss due to his/her senility and the like.

Consequently, the above-mentioned characterized features of the present invention are capable of further fueling the demand for the mobile communication unit, and therefore have a large economic effect on the communication industry.

What is claimed is:

1. A mobile communication unit comprising:
    a bone conduction speaker through which a user listens to a received voice sound;
    a front surface of the bone conduction speaker formed flat for soft contact with a user's forehead, temple, cheekbone or an area between the user's eyes;
    a main body having a microphone therein;
    the bone conduction speaker being spaced apart from the main body and the microphone;
    the bone conduction speaker having a vibrating portion with a rear surface;
    a finger-mounted portion fixed on the rear surface; wherein the finger-mounted portion has a cap shape or a ring shape; and
    wherein the bone conduction speaker can be mounted on a finger tip of the user through said finger-mounted portion for contact with the user's forehead, temple, cheekbone or an area between the user's eyes.

2. The mobile communication unit as set forth in claim 1, wherein an electric connecting cord (4) for connecting said bone conduction speaker (1) with said main body (2) of said mobile communication unit can be withdrawn for storage into said main body (2) of said mobile communication unit by means of a take-up reel when not in use.

3. The mobile communication unit as set forth in claim 1, wherein a clip is provided in a rear side of the main body of said mobile communication unit enabling the main body to be mounted on a band (6) of a wrist watch of the user.

* * * * *